(12) United States Patent
Lim et al.

(10) Patent No.: US 7,612,623 B2
(45) Date of Patent: Nov. 3, 2009

(54) MICROPOWER RC OSCILLATOR

(75) Inventors: Joon Hyung Lim, Gunpo (KR);
Myeung Su Kim, Suwon (KR); Yong Il Kwon, Suwon (KR); Tah Joon Park, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 33 days.

(21) Appl. No.: 11/756,032

(22) Filed: May 31, 2007

(65) Prior Publication Data

US 2008/0055012 A1 Mar. 6, 2008

(30) Foreign Application Priority Data

Jun. 1, 2006 (KR) .................. 10-2006-0049299

(51) Int. Cl.
*H03K 3/26* (2006.01)

(52) U.S. Cl. ................. 331/143; 331/36 C; 331/111

(58) Field of Classification Search ............. 331/111, 331/113 R, 143, 144, 36 C
See application file for complete search history.

(56) References Cited

U.S. PATENT DOCUMENTS

| 5,699,024 | A | * | 12/1997 | Manlove et al. ............. 331/111 |
| 6,005,449 | A | | 12/1999 | Oberlin |
| 6,462,625 | B2 | | 10/2002 | Kim |
| 7,176,765 | B1 | * | 2/2007 | Shorb et al. ................. 331/111 |
| 2006/0061345 | A1 | | 3/2006 | Mihara |
| 2006/0226922 | A1 | * | 10/2006 | Rajagopal et al. ........... 331/143 |

FOREIGN PATENT DOCUMENTS

| KR | 1998-65103 | | 10/1998 |
| KR | 2000-51246 | A | 8/2000 |
| KR | 2002-37449 | A | 5/2002 |

* cited by examiner

*Primary Examiner*—Robert Pascal
*Assistant Examiner*—James E Goodley
(74) *Attorney, Agent, or Firm*—Lowe Hauptman Ham & Berner, LLP

(57) ABSTRACT

A micropower RC oscillator comprises a current generating section including a current source that generates a current; and a variable resistor of which the magnitude is variably set and which is configured by combining resistor elements at a predetermined ratio, the resistor elements having opposite characteristics to each other with respect to a temperature change, the variable resistor adjusting the magnitude of the generated current; a start-up circuit section connected to the current generating section and fixing a bias operating point to a constant value such that the current generating section stably generates a current; a charge and discharge circuit section including a variable capacitor, of which the magnitude is variably set, and a plurality of transistors, the charge and discharge circuit section charging and discharging the variable capacitor by using the current generated from the current generating section and the plurality of transistors; an oscillation signal output section connected to the charge and discharge circuit section and including a plurality of inverters, the oscillation signal output section outputting an oscillation signal of which the frequency is determined by the resistance of the variable resistor and the capacitance of the variable capacitor; and an inverter driving power supply section mirroring the current generated from the current generating section and then providing the mirrored current as a driving power supply of the inverters.

8 Claims, 3 Drawing Sheets

US 7,612,623 B2

MICROPOWER RC OSCILLATOR

CROSS-REFERENCE TO RELATED APPLICATIONS

This application claims the benefit of Korean Patent Application No. 10-2006-0049299 filed with the Korea Intellectual Property Office on Jun. 1, 2006, the disclosure of which is incorporated herein by reference.

BACKGROUND OF THE INVENTION

1. Field of the Invention

The present invention relates to a micropower RC oscillator which can secure a stable current source, use a variable resistor and a variable capacitor such that the system-on-chip of passive elements can be realized, and can stably operate with respect to changes in temperature and process.

2. Description of the Related Art

In general, oscillator circuits serve to provide a clock signal or timing signal to electronic circuits such as a microprocessor, a micro controller, a flip-flop circuit, a latch circuit and the like and are widely applied to various fields in the electronic industry. An accurate and stabilized reference frequency can be obtained using a crystal oscillator circuit.

In many application fields, however, such a high-quality reference frequency is not need, and mass productivity needs to be considered. Therefore, an RC oscillator circuit can serve as a low-cost clock signal source or timing signal source. Further, such an RC oscillator circuit can generate a variable frequency by varying resistance R or capacitance C, and inductors which are hard to process into an integrated circuit can be prevented from being used in the RC oscillator circuit.

In mobile systems such as mobile terminals or portable electronic apparatuses using batteries, ultra-low current consumption is required. Therefore, micropower RC oscillators are advantageous in such an application field, because low power consumption is advantageous in enlarging the lifetime of a battery.

As other requirements for RC oscillators, operation characteristics with respect to changes in temperature and process, or particularly, an oscillation frequency characteristic should be stable. Further, the RC oscillators should be able to be implemented simply and at a low cost through a configuration in which passive elements with a relatively large size are disposed in a chip.

FIG. 1 is a circuit diagram of a conventional RC oscillator. As shown in FIG. 1, the conventional RC oscillator 100 roughly includes a current generating section 110, a charge and discharge circuit section 120, and an oscillation signal output section 130.

The current generating section 110 generates a current and supplies the generated current through a mirroring section 140.

The charge and discharge section 120 includes a capacitor C and a plurality of transistors 121 to 123. The charge and discharge section 120 charges and discharges the capacitor C by using the current generated from the current generating section 110 and the plurality of transistors 121 to 123.

The oscillation signal output section 130 connected to the charge and discharge circuit section 120 includes a plurality of inverters 131 and 132 and outputs an oscillation signal RC_OSC_OUT of which the frequency is determined by a resistor R and the capacitor C.

The RC oscillator configured in such a manner operates as follows.

When a power supply voltage VDD is applied, the current generating section 110 is operated to generate a current, and the generated current is supplied to a current source through the mirroring section 140.

Then, a voltage is charged into the capacitor C by the supplied current. The charged voltage drives a first inverter 131 of the oscillation signal output section 130 through the transistor 121 of the charge and discharge circuit section 120.

Further, a signal output from the last inverter 132 of the oscillation signal output section 130 is fed back to operate the transistors 122 and 123 of the charge and discharge circuit section 120. Accordingly, as the capacitor C is discharged, an oscillation signal RC_OSC_OUT having a rectangular clock shape is output.

In the conventional RC oscillator, however, the power supply voltage is directly applied as a driving power supply of the plurality of inverters outputting an oscillation signal such that current consumption increases. Accordingly, the lifetime of battery of a mobile system using the RC oscillator is reduced.

Further, resistance and capacitance cannot be changed freely so that the system-on-chip of passive elements is impossible. Accordingly, a large cost is required for implementing such an RC oscillator. The RC oscillator sensitively reacts with changes in temperature and process, thereby outputting an unstable oscillation signal.

In addition, a bias operating point can be fixed to zero (0) such that the RC oscillator itself may be not operated.

FIG. 2 is a graph showing a current $I_D$ of the current generating section in accordance with a bias voltage $V_{GS}$. As shown in FIG. 2, bias operating points on a load line are represented as two points A and B. If the point A with a value of zero is fixed to the bias operating point, the RC oscillator itself may not be operated.

SUMMARY OF THE INVENTION

An advantage of the present invention is that it provides a micropower RC oscillator which mirrors a current of a current source and provides the mirrored current as a driving power supply of inverters, thereby reducing current consumption. Accordingly, it is possible to enlarge the lifetime of battery of a mobile system using the RC oscillator.

Another advantage of the invention is that it provides a micropower RC oscillator which can realize system-on-chip of passive elements by using a variable resistor and a variable capacitor and can stably operate with respect to changes in temperature and process.

A further advantage of the invention is that it provides a micropower RC oscillator to which a start-up circuit section is added so that the micropower RC oscillator can have a bias operating point at which a current can be stably generated. Accordingly, the micropower RC oscillator can perform a stabilized operation.

Additional aspect and advantages of the present general inventive concept will be set forth in part in the description which follows and, in part, will be obvious from the description, or may be learned by practice of the general inventive concept.

According to an aspect of the invention, a micropower RC oscillator comprises a current generating section including a current source that generates a current; and a variable resistor of which the magnitude is variably set and which is configured by combining resistor elements at a predetermined ratio, the resistor elements having opposite characteristics to each other with respect to a temperature change, the variable resistor adjusting the magnitude of the generated current; a start-up circuit section connected to the current generating section and fixing a bias operating point to a constant value such that the current generating section stably generates a current; a charge and discharge circuit section including a variable capacitor, of which the magnitude is variably set, and a plurality of transistors, the charge and discharge circuit section charging and discharging the variable capacitor by using the current generated from the current generating section and the plurality of transistors; an oscillation signal output section connected to the charge and discharge circuit section and including a plurality of inverters, the oscillation signal output section outputting an oscillation signal of which the frequency is determined by the resistance of the variable resistor and the capacitance of the variable capacitor; and an inverter driving power supply section mirroring the current generated from the current generating section and then providing the mirrored current as a driving power supply of the inverters.

Preferably, the variable resistor is configured to have a self-temperature compensation characteristic by combining N diffused resistors and polysilicon resistors at a predetermined ratio, the N diffused resistors and the polysilicon resistors having opposite characteristics to each other with respect to a temperature change.

Preferably, the start-up circuit section includes first to third transistors, each of which is provided with first to third terminals and in which the magnitude and direction of a current flowing from the second terminal to the third terminal are varied on the basis of the magnitude of a voltage applied between the first and second terminals. The first terminal of the first transistor is connected to the first terminal of the second transistor, the second terminal thereof is connected to a power supply voltage, and the third terminal thereof is connected to the first terminal; the first terminal of the second transistor is connected to the first terminal of the first transistor, the second terminal thereof is connected to the current generating section, and the third terminal thereof is connected to the power supply voltage; and the first terminal of the third transistor is connected to the first terminal of the second transistor, the second terminal thereof is grounded, and the third terminal thereof is connected to the first terminal of the second transistor.

Preferably, the plurality of transistors included in the charge and discharge circuit section are fourth to sixth transistors, each of which is provided with first to third terminals and in which the magnitude and direction of a current flowing from the second terminal to the third terminal are varied on the basis of the magnitude of a voltage applied between the first and second terminals. The first terminal of the fourth transistor is connected between the current source and the variable resistor, the second terminal thereof is grounded, and the third terminal thereof is connected to the variable capacitor so as to charge the variable capacitor; the first terminal of the fifth transistor is connected to the variable capacitor, the second terminal thereof is grounded, and the third terminal thereof is connected to the plurality of inverters so as to drive the inverters; and a signal output from the last inverter among the plurality of inverters is fed back to the first terminal of the sixth transistor, the second terminal of the sixth transistor is connected to the inverter driving power supply section, and the third terminal thereof is connected to the variable capacitor so as to discharge a voltage charged in the variable capacitor through an on/off operation.

Preferably, the inverter driving power supply section includes seventh to ninth transistors, each of which is provided with first to third terminal and in which the magnitude and direction of a current flowing from the second terminal to the third terminal are varied on the basis of the magnitude of a voltage applied between the first and second terminals. The first terminals of the seventh to ninth transistors are connected in series to each other so as to mirror the current generated from the current source, the second terminals of the seventh to ninth transistors are respectively connected to the power supply voltage, the third terminals of the seventh and eighth transistors are respectively connected to the charge and discharge circuit section, and the third terminal of the ninth transistor is connected to the plurality of inverters such that the mirrored current is provided as a driving power supply of the inverters.

Preferably, the first to third terminals are a gate, a source, and a drain, respectively.

According to another aspect of the invention, a micropower RC oscillator comprises a current generating section including a current source that generates a current; and a variable resistor of which the magnitude is variably set and which is configured by combining resistor elements at a predetermined ratio, the resistor elements having opposite characteristics to each other with respect to a temperature change, the variable resistor adjusting the magnitude of the generated current; a charge and discharge circuit section including a variable capacitor, of which the magnitude is variably set, and a plurality of transistors, the charge and discharge circuit section charging and discharging the variable capacitor by using the current generated from the current generating section and the plurality of transistors; an oscillation signal output section connected to the charge and discharge circuit section and including a plurality of inverters, the oscillation signal output section outputting an oscillation signal of which the frequency is determined by the resistance of the variable resistor and the capacitance of the variable capacitor; and an inverter driving power supply section mirroring the current generated from the current generating section and then providing the mirrored current as a driving power supply of the inverters.

Preferably, the variable resistor is configured to have a self-temperature compensation characteristic by combining N diffused resistors and polysilicon resistors at a predetermined ratio, the N diffused resistors and the polysilicon resistors having opposite characteristics to each other with respect to a temperature change.

Preferably, the plurality of transistors included in the charge and discharge circuit section are first to third transistors, each of which is provided with first to third terminals and in which the magnitude and direction of a current flowing from the second terminal to the third terminal are varied on the basis of the magnitude of a voltage applied between the first and second terminals. The first terminal of the first transistor is connected between the current source and the variable resistor, the second terminal thereof is grounded, and the third terminal thereof is connected to the variable capacitor so as to charge the variable capacitor; the first terminal of the second transistor is connected to the variable capacitor, the second terminal thereof is grounded, and the third terminal thereof is connected to the plurality of inverters so as to drive the inverters; and a signal output from the last inverter among the plurality of inverters is fed back to the first terminal of the third transistor, the second terminal of the third transistor is connected to the inverter driving power supply section, and the third terminal thereof is connected to the variable capacitor so as to discharge a voltage charged in the variable capacitor.

Preferably, the inverter driving power supply section includes fourth to sixth transistors, each of which is provided with first to third terminal and in which the magnitude and direction of a current flowing from the second terminal to the third terminal are varied on the basis of the magnitude of a voltage applied between the first and second terminals. The first terminals of the fourth to sixth transistors are connected in series to each other so as to mirror the current generated from the current source, the second terminals of the fourth to sixth transistors are respectively connected to the power supply voltage, the third terminals of the fourth and fifth transistors are respectively connected to the charge and discharge circuit section, and the third terminal of the sixth transistor is connected to the plurality of inverters such that the mirrored current is provided as a driving power supply of the inverters.

Preferably, the first to third terminals are a gate, a source, and a drain, respectively.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
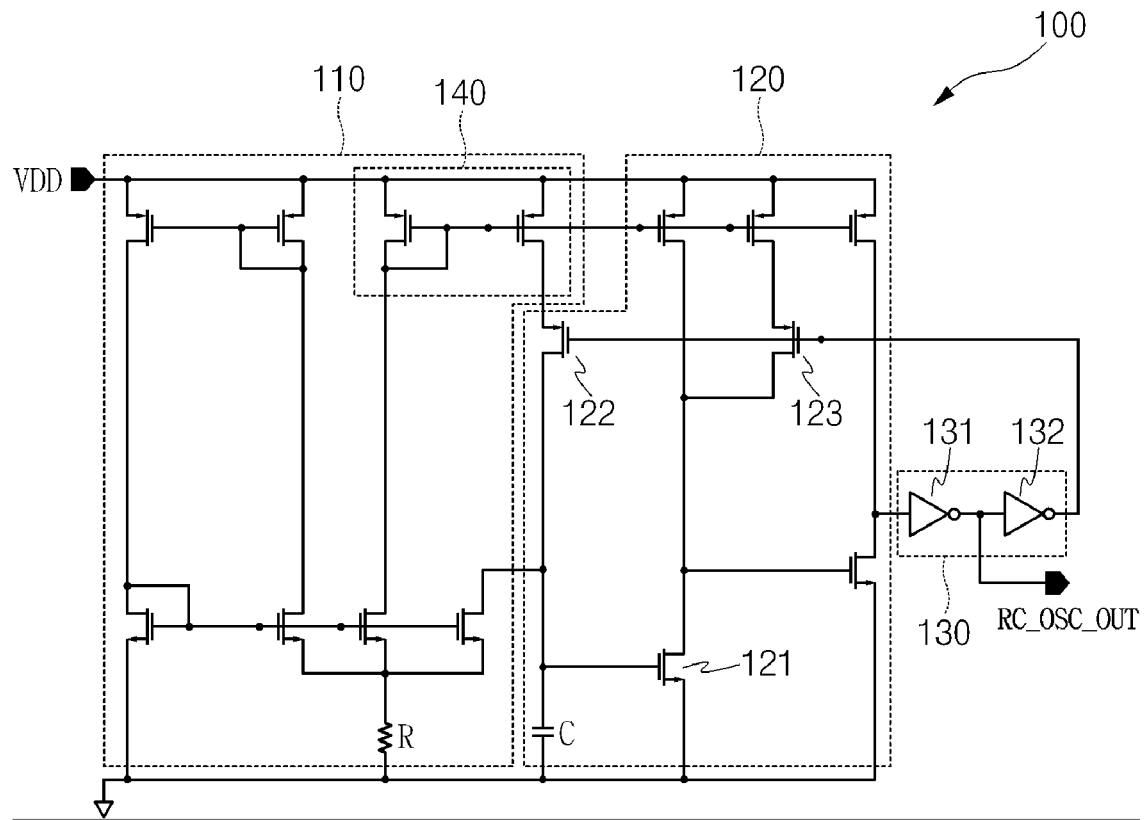
FIG. 1 is a circuit diagram of a conventional RC oscillator.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, embodiments of the present invention will be described in detail with reference to the accompanying drawings.

Before the embodiments of the invention are described, the configuration of a micropower RC oscillator according to the invention will be described briefly. The micropower RC oscillator uses a plurality of transistors, each of which is provided with a gate, a source, and a drain serving as first to third terminals, respectively. In each of the transistors, the magnitude and direction of a current flowing from the drain to the source or from the source to the drain is determined by the magnitude and polarity of a voltage applied between the gate and the source.

As for the transistors, there are provided a bipolar junction transistor (BJT), a junction gate field-effect transistor (JFET), a metal-oxide-semiconductor field-effect transistor (MOSFET), a metal-semiconductor field-effect transistor (MESFET) and the like.

The following descriptions will be focused on the MOSFET. However, the invention can be applied to all the transistors having the above-described characteristic as well as the MOSFET. Therefore, although the descriptions of the invention are focused on the MOSFET, the scope of the invention is not limited to the MOSFET.

First Embodiment

Hereinafter, a micropower RC oscillator according to a first embodiment of the invention will be described in detail with reference to the accompanying drawings.

Figure 3:
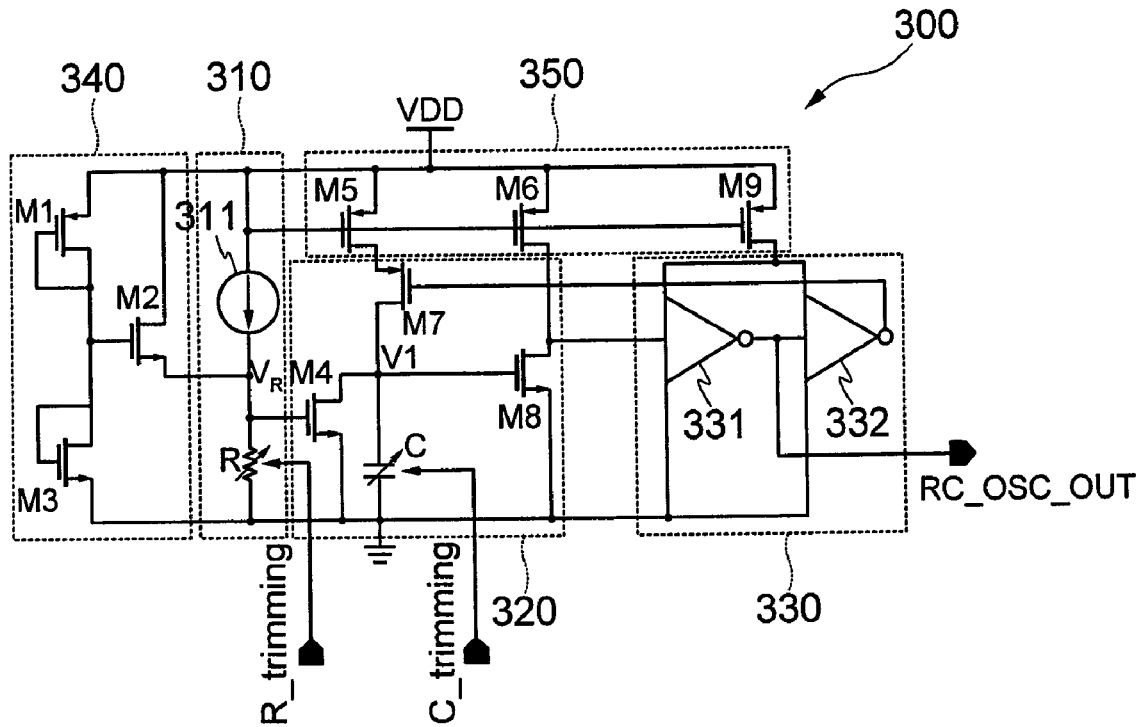
FIG. 3 is a circuit diagram of a micropower RC oscillator according to a first embodiment of the invention.

FIG. 3 is a circuit diagram of the micropower RC oscillator according to the first embodiment of the invention. As shown in FIG. 3, the micropower RC oscillator 300 includes a current generating section 310, a charge and discharge circuit section 320, an oscillation signal output section 330, a start-up circuit section 340, and an inverter driving power supply section 350.

The current generating section 310 includes a current source 311, which generates a current, and a variable resistor R of which the magnitude is variably set and which is configured by combining resistor elements at a predetermined ratio, the resistor elements having opposite characteristics to each other with respect to a temperature change. The magnitude of the generated current is adjusted by the variable resistor R.

Figure 4A:
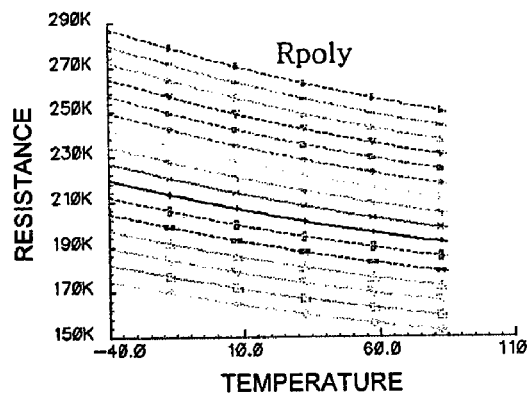
FIG. 4A is a graph for a polysilicon resistor (Rpoly) having inversely proportional resistance to a temperature change.
Figure 4B:
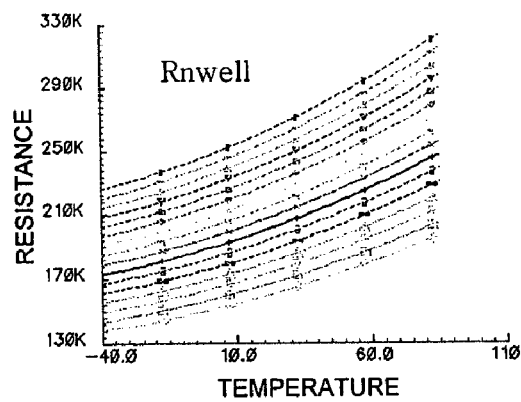
FIG. 4B is a graph for an N diffused resistor (Rnwell) having proportional resistance to a temperature change.
Figure 4C:
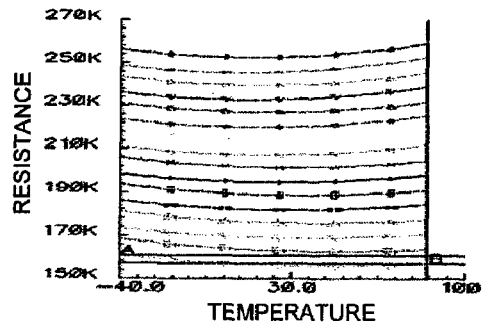
FIG. 4C is a graph showing a resistance characteristic of a variable resistor which is configured by combining the N diffused resistors and the polysilicon resistors at a ratio of 3 to 2.

In this case, N diffused resistors and polysilicon resistors having opposite characteristics to each other with respect to a temperature change are combined at a predetermined ratio such that the variable resistor R can have a self-temperature compensation characteristic. FIGS. 4A to 4C are graphs for explaining that. FIG. 4A is a graph for a polysilicon resistor (Rpoly) having inversely proportional resistance to a temperature change. FIG. 4B is a graph for an N diffused resistor (Rnwell) having proportional resistance to a temperature change. FIG. 4C is a graph showing a resistance characteristic of a variable resistor which is configured by combining the N diffused resistors and the polysilicon resistors at a ratio of 3 to 2.

When the variable resistor R is configured by combining the N diffused resistors and the polysilicon resistors at a predetermined ratio, it can be found that resistance hardly changes with respect to a temperature change, as shown in FIG. 4C. Accordingly, it is possible to implement an RC oscillator which is relatively stable with respect to a temperature change.

The start-up circuit section 340 including first to third MOSFETs M1 to M3 is connected to the current generating section 310 and fixes a bias operating point to a constant value such that the current generating section 310 can stably generate a current.

Figure 2:
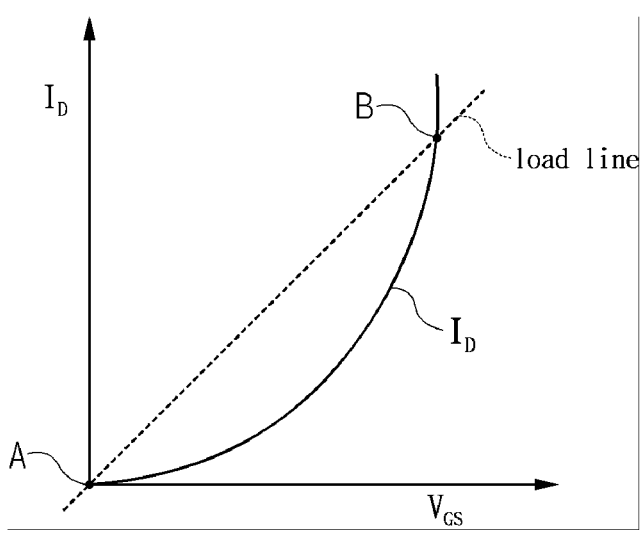
FIG. 2 is a graph showing a current of a current generating section in accordance with a bias voltage.

That is, as the start-up circuit section 340 is added, the bias operating point can be fixed to the point B of FIG. 2 which has been described above. Accordingly, since a current can be stably supplied to the RC oscillator, it is possible to solve such a problem that the RC oscillator itself is not operated, which will be described in the following operational process.

The gate of the first MOSFET M1 is connected to the gate of the second MOSFET M2, the source thereof is connected to a power supply voltage VDD, and the drain thereof is connected to the gate of the second MOSFET M2.

The gate of the second MOSFET M2 is connected to the gate of the first MOSFET M1, the source thereof is connected to the current generating section 310, and the drain thereof is connected to the power supply voltage VDD.

The gate of the third MOSFET M3 is connected to the gate of the second MOSFET M2, the source thereof is grounded, and the drain thereof is connected to the gate of the second MOSFET M2.

The charge and discharge circuit section 320 includes a variable capacitor C of which the magnitude is variably set and fourth to sixth MOSFETs M4, M7, and M8. The charge and discharge circuit section 320 charges and discharges the variable capacitor C by using the current generated from the current generating section 310 and the fourth to sixth MOSFETs M4, M7, and M8. The oscillation signal output section 330 including a plurality of inverters 331 and 332 is connected to the charge and discharge circuit section 320 so as to output an oscillation signal RC_OSC_OUT of which the frequency is determined by the resistance of the variable resistor R and the capacitance of the variable capacitor C.

The gate of the fourth MOSFET M4 is connected between the current source and the variable resistor R, the source thereof is grounded, and the drain thereof is connected to the variable capacitor C so as to charge the variable capacitor C.

The gate of the fifth MOSFET M8 is connected to the variable capacitor C, the source thereof is grounded, and the drain thereof is connected to the inverters 331 and 332 of the oscillation signal output section 330 so as to drive the inverters 331 and 332.

In the sixth MOSFET M7, a signal output from the last inverter 331 is fed back to the gate of the sixth MOSFET M7. The source of the sixth MOSFET M7 is connected to the inverter driving power supply section 350, and the drain thereof is connected to the variable capacitor C so as to discharge a voltage V1 charged in the variable capacitor C through an on/off operation.

The inverter driving power supply section 350 including seventh to ninth MOSFETs M5, M6, and M9 mirrors the current generated from the current generating section 310 and then provides the mirrored current to a driving power supply of the plurality of inverters 331 and 332.

In this case, the gates of the seventh to ninth MOSFETs M5, M6, and M9 are connected in series so as to mirror the current generated from the current source 311, and the sources thereof are respectively connected to the power supply voltage VDD.

Further, the drains of the seventh and eighth MOSFETs M5 and M6 are connected to the charge and discharge circuit section 320, and the drain of the ninth MOSFET M9 is connected to the plurality of inverters 331 and 332 so as to provide the mirrored current as a driving power supply of the inverters 331 and 332.

The operational process of the micropower RC oscillator configured in such a manner will be described as follows.

When a power supply voltage VDD is applied, the first and second MOSFETs M1 and M2 are turned on, and thus the source voltage of the second MOSFET is fixed. Then, the bias operating point of the fourth MOSFET M4 can be always fixed to the point B of FIG. 2 such that the current generating section 310 can stably supply a current. Accordingly, it is possible to solve such a problem that the RC oscillator itself is not operated. In this case, a current to be stably supplied is represented by the following Equation 3, and the magnitude of the current can be adjusted by the variable resistor R which is capable of trimming resistance.

The current generated from the current generating section 310 is charged into the variable capacitor C by the fourth MOSFET M4, and the fifth MOSFET M8 is turned on by detecting the charged voltage. Then, the first inverter 331 of the oscillation signal output section 330 is driven.

Further, the last inverter 332 of the oscillation signal output section 330 feeds an output signal back to the sixth MOSFET M7, and the fed-back signal causes the sixth MOSFET M7 to perform a switching operation such that the voltage charged in the variable capacitor C is discharged. At this time, hysteresis of charge and discharge is adjusted by the fifth MOSFET M8.

Meanwhile, the current generated from the current source 311 (in this embodiment, a current of less than 100 nA flows) is mirrored through the MOSFETs M5, M6, and M9 of the inverter driving power supply section 350, and the mirrored current is provided as a driving power supply of the inverters 331 and 332 included in the oscillation signal output section 330. At this time, the MOSFETs M5, M6, and M9 of the inverter driving power supply section 350 are designed in such a manner that the mirrored current corresponds to a smaller current (corresponding to a current of 50 nA in this embodiment) than the current generated from the current source.

The oscillation signal output section 330 outputs an oscillation signal RC_OSC_OUT of which the frequency is determined by an amount of generated current and capacitance. The capacitance can be adjusted by trimming the variable capacitor C.

Second Embodiment

Figure 5:
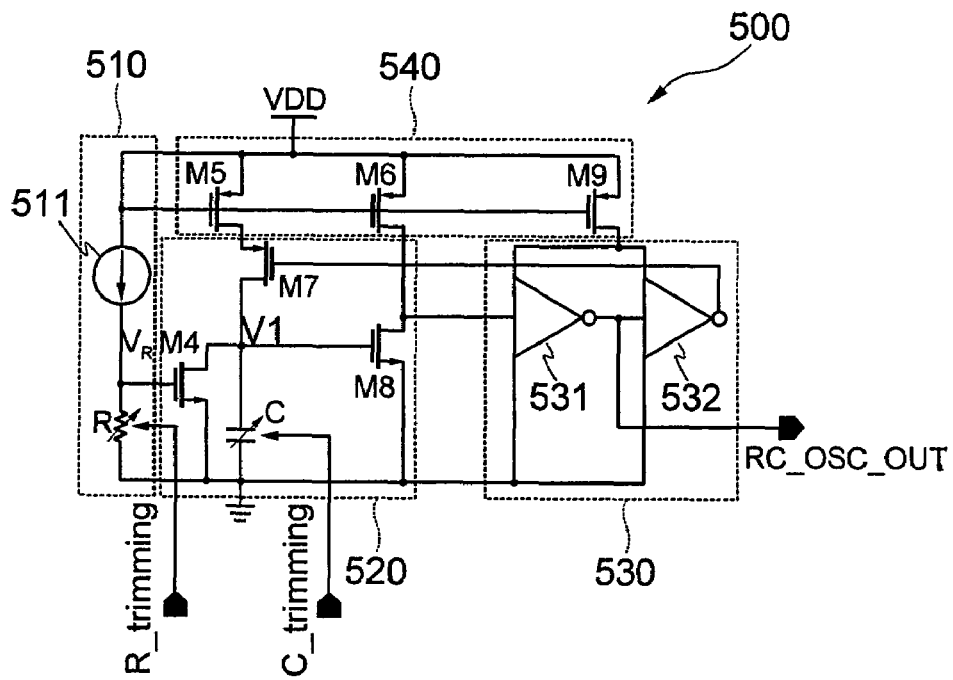
FIG. 5 is a circuit diagram of a micropower RC oscillator according to a second embodiment of the invention.

FIG. 5 is a circuit diagram of a micropower RC oscillator according to a second embodiment of the invention. As shown in FIG. 5, the micropower RC oscillator 500 according to the second embodiment includes a current generating section 510, a charge and discharge circuit section 520, an oscillation signal output section 530, and an inverter driving power supply section 540.

The current generating section 510 includes a current source 511, which generates a current, and a variable resistor R of which the magnitude is variably set and which is configured by combining resistor elements at a predetermined ratio, the resistor elements having opposite characteristics to each other with respect to a temperature change. The magnitude of the generated current is adjusted by the resistor R.

In this case, N diffused resistors and polysilicon resistors having opposite characteristics to each other with respect to a temperature change are combined at a predetermined ratio such that the variable resistor R can have a self-temperature compensation characteristic. This can be also explained with reference to FIGS. 4A to 4C, similar to the first embodiment. When the variable resistor R is configured by combining the N diffused resistors and the polysilicon resistors at a predetermined ratio, it can be found that resistance hardly changes with respect to a temperature change, as shown in FIG. 4C. Accordingly, it is possible to implement an RC oscillator which is relatively stable with respect to a temperature change.

The charge and discharge circuit section 520 includes a variable capacitor C, of which the magnitude is variably set, and first to third MOSFETs M4, M7, and M8. The charge and discharge circuit section 520 charges and discharges the variable capacitor C by using the current generated from the current generating section 510 and the first to third MOSFETs M4, M7, and M8. The oscillation signal output section 530 including a plurality of inverters 531 and 532 is connected to the charge and discharge circuit section 520 so as to output an oscillation signal RC_OSC_OUT of which the frequency is determined by the resistance of the variable resistor R and the capacitance of the variable capacitor C.

The gate of the first MOSFET M4 is connected between the current source and the variable resistor R, the source thereof is grounded, and the drain thereof is connected to the variable capacitor C so as to charge the variable capacitor C.

The gate of the second MOSFET M8 is connected to the variable capacitor C, the source thereof is grounded, and the drain thereof is connected to the plurality of inverters 531 and 532 of the oscillation signal output section 530 so as to drive the inverters 531 and 532.

In the third MOSFET M7, a signal output from the last inverter 532 among the plurality of inverters is fed back to the gate of the third MOSFET M7, the source thereof is connected to the inverter driving power supply section 540, and the drain thereof is connected to the variable capacitor C so as to discharge a voltage V1 charged in the variable capacitor C through an on/off operation.

The inverter driving power supply section 540 including fourth to sixth MOSFETs M5, M6, and M9 mirrors the current generated from the current generating section 510 and then provides the mirrored current as a driving power supply of the inverters 531 and 532.

The fourth to sixth MOSFETs M5, M6, and M9 connected in series to each other through the gates thereof mirrors the current generated from the current source 511, and the sources thereof are respectively connected to the power supply voltage VDD.

The drains of the fourth to fifth MOSFETs M5 and M6 are connected to the charge and discharge circuit section 520, and the drain of the sixth MOSFET M9 is connected to the plurality of inverters 531 and 532 so as to provide the mirrored current as a driving power supply of the inverters 531 and 532.

An operational process of the micropower RC oscillator configured in such a manner will be described as follows.

When a power supply voltage VDD is applied, the bias operating point of the first MOSFET M4 is fixed, and thus the current generating section 510 supplies a current. In this case, the supplied current is represented by the following Equation 3. The magnitude of the current can be adjusted by the variable resistor R which is capable of trimming resistance.

The variable capacitor C is charged with the current generated from the current generating section 510 by the first MOSFET M4, and the second MOSFET M8 is turned on by detecting the charged voltage. Then, the first inverter 531 of the oscillation signal output section 530 is operated.

The last inverter 532 of the oscillation signal output section 530 feeds an output signal back to the third MOSFET M7, and the fed-back signal causes the third MOSFET M7 to perform a switching operation such that the voltage charged in the variable capacitor C is discharged. At this time, hysteresis of charge and discharge is adjusted by the second MOSFET M8.

Meanwhile, the current generated from the current source 611 (in this embodiment, a current of less than 100 nA flows) is mirrored through the MOSFETs M5, M6, and M9 of the inverter driving power supply section 540, and the mirrored current is provided as a driving power supply of the inverters 531 and 532 included in the oscillation signal output section 530. At this time, the MOSFETs M5, M6, and M9 of the inverter driving power supply section 530 are designed in such a manner that the mirrored current corresponds to a smaller current (corresponding to a current of about 50 nA in this embodiment) than the current generated from the current source.

The oscillation signal output section 530 outputs an oscillation signal RC_OSC_OUT of which the frequency is determined by an amount of generated current and capacitance. The capacitance can be adjusted by trimming the variable capacitor C.

Figure 6:
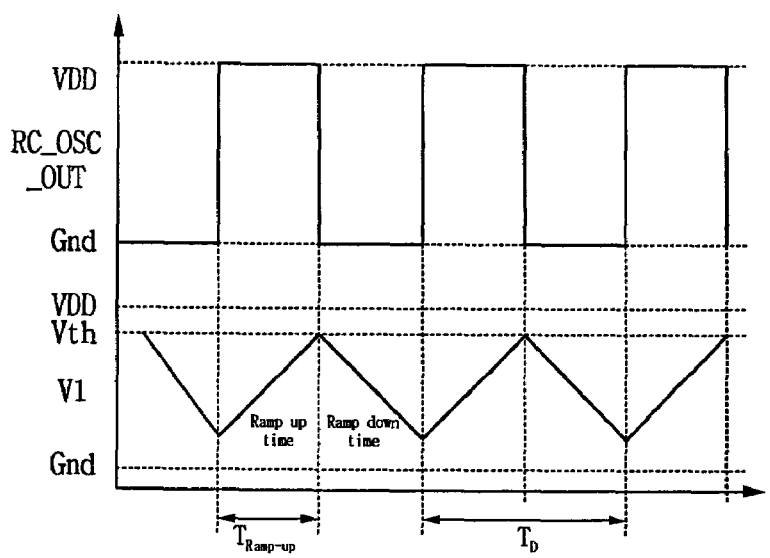
FIG. 6 is a graph showing outputs of the micropower RC oscillators according to the first and second embodiment of the invention.

FIG. 6 is a graph showing outputs of the micropower RC oscillators according to the first and second embodiment of the invention. The frequency of the signal output through the oscillation signal output section can be calculated by the following Equations 1 to 6.

$$\Delta V1 = \frac{I \times \Delta t}{C} \quad \text{[Equation 1]}$$

Here, $\Delta V1$ represents a quantity of change in voltage to be charged into the variable capacitor C in accordance with the time. Further, $\Delta t$ represents time, during which the variable capacitor C is charged, and is calculated by Equation 2.

$$T_{Ramp-up} = \Delta t = \frac{C \times \Delta V1}{I} \quad \text{[Equation 2]}$$

Here, I represents an amount of current to be generated from the current generating section 310 or 510 and is calculated by Equation 3.

$$I = \frac{V_R}{R} \quad \text{[Equation 3]}$$

When Equation 2 is substituted to Equation 3, $\Delta t$ can be represented by Equation 4.

$$T_{Ramp-up} = \Delta t = \frac{C \times \Delta V1}{\frac{V_R}{R}} = RC \times \frac{\Delta V1}{V_R} \quad \text{[Equation 4]}$$

$$T_D = 2 \times T_{Ramp-up} \quad \text{[Equation 5]}$$

Here, $T_D$ represents the period of the oscillation signal RC_OSC_OUT and can be calculated by using Equation 4. Finally, the frequency of the oscillation signal RC_OSC_OUT can be calculated by Equation 6 using Equation 5.

$$F_{OSC} = \frac{1}{T_D} = \frac{V_R}{2RC\Delta V1} \quad \text{[Equation 6]}$$

According to the invention, the micropower RC oscillator mirrors a current of the current source and provides the mirrored current as a driving power supply of the inverters. Therefore, current consumption can be reduced, which makes it possible to increase the lifetime of a battery which is used in a mobile system using the RC oscillator.

Further, as the variable resistor and the variable capacitor are used, the system-on-chip of passive elements can be realized. Further, the micropower RC oscillator can operate stably with respect to changes in temperature and process.

Further, as the start-up circuit section is added, the micropower RC oscillator has a bias operating point at which a current can be stably generated. Therefore, the micropower RC oscillator can perform a stable operation.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A micropower RC oscillator comprising:
   a current generating section including:
   a current source that generates a current; and
   a variable resistor of which the magnitude is variably set and which is configured by combining resistor elements at a predetermined ratio, the resistor elements having opposite characteristics to each other with respect to a temperature change,
   wherein the magnitude of the generated current is adjusted by the variable resistor;
   a start-up circuit section connected to the current generating section and fixing a bias operating point to a constant value such that the current generating section stably generates a current;
   a charge and discharge circuit section including a variable capacitor, of which the magnitude is variably set, and a plurality of transistors, the charge and discharge circuit section charging and discharging the variable capacitor by using the current generated from the current generating section and the plurality of transistors;
   an oscillation signal output section connected to the charge and discharge circuit section and including a plurality of inverters, the oscillation signal output section outputting an oscillation signal of which the frequency is determined by the resistance of the variable resistor and the capacitance of the variable capacitor; and
   an inverter driving power supply section mirroring the current generated from the current generating section and then providing the mirrored current as a driving power supply of the inverters;
   wherein the start-up circuit section includes first to third transistors, each of which is provided with first to third terminals and in which the magnitude and direction of a current flowing from the second terminal to the third terminal are varied on the basis of the magnitude of a voltage applied between the first and second terminals.

2. The micropower RC oscillator according to claim 1, wherein the variable resistor is configured to have a self-temperature compensation characteristic by combining N diffused resistors and polysilicon resistors at a predetermined ratio, the N diffused resistors and the polysilicon resistors having opposite characteristics to each other with respect to a temperature change.

3. The micropower RC oscillator according to claim 1, wherein the first terminal of the first transistor is connected to the first terminal of the second transistor, the second terminal thereof is connected to a power supply voltage, and the third terminal thereof is connected to the first terminal of the second transistor;
   the first terminal of the second transistor is connected to the first terminal of the first transistor, the second terminal thereof is connected to the current generating section, and the third terminal thereof is connected to the power supply voltage; and
   the first terminal of the third transistor is connected to the first terminal of the second transistor, the second terminal thereof is grounded, and the third terminal thereof is connected to the first terminal of the second transistor.

4. The micropower RC oscillator according to claim 1, wherein the plurality of transistors included in the charge and discharge circuit section are fourth to sixth transistors, each of which is provided with first to third terminals and in which the magnitude and direction of a current flowing from the second terminal to the third terminal are varied on the basis of the magnitude of a voltage applied between the first and second terminals.

5. The micropower RC oscillator according to claim 4, wherein the first terminal of the fourth transistor is connected between the current source and the variable resistor, the second terminal thereof is grounded, and the third terminal thereof is connected to the variable capacitor so as to charge the variable capacitor;
   the first terminal of the fifth transistor is connected to the variable capacitor, the second terminal thereof is grounded, and the third terminal thereof is connected to the plurality of inverters so as to drive the inverters; and
   a signal output from the last inverter among the plurality of inverters is fed back to the first terminal of the sixth transistor, the second terminal of the sixth transistor is connected to the inverter driving power supply section, and the third terminal thereof is connected to the variable capacitor so as to discharge a voltage charged in the variable capacitor through an on/off operation.

6. The micropower RC oscillator according to claim 1, wherein the inverter driving power supply section includes seventh to ninth transistors, each of which is provided with first to third terminal and in which the magnitude and direction of a current flowing from the second terminal to the third terminal are varied on the basis of the magnitude of a voltage applied between the first and second terminals.

7. The micropower RC oscillator according to claim 6, wherein the first terminals of the seventh to ninth transistors are connected in series to each other so as to mirror the current generated from the current source,
   the second terminals of the seventh to ninth transistors are respectively connected to the power supply voltage,
   the third terminals of the seventh and eighth transistors are respectively connected to the charge and discharge circuit section, and
   the third terminal of the ninth transistor is connected to the plurality of inverters such that the mirrored current is provided as a driving power supply of the inverters.

8. The micropower RC oscillator according to claim 1, wherein the first to third terminals are a gate, a source, and a drain, respectively.

* * * * *